United States Patent
Lo et al.

(10) Patent No.: US 8,552,630 B2
(45) Date of Patent: Oct. 8, 2013

(54) LIGHTING FIXTURE WITH REPLACEABLE LIGHT SOURCE

(75) Inventors: Wai Cheong Lo, Central (HK); Wai Kuen Chang, Central (HK)

(73) Assignee: Seitech Electronics Limited, Central, Hong Kong (CN)

( * ) Notice: Subject to any disclaimer, the term of this patent is extended or adjusted under 35 U.S.C. 154(b) by 0 days.

(21) Appl. No.: 13/225,513

(22) Filed: Sep. 5, 2011

(65) Prior Publication Data

US 2012/0262089 A1    Oct. 18, 2012

(30) Foreign Application Priority Data

Apr. 12, 2011    (HK) .................................. 11103686.0

(51) Int. Cl.
*H01J 5/48* (2006.01)
(52) U.S. Cl.
USPC ........................ 313/318.01; 362/362; 362/800
(58) Field of Classification Search
USPC ............. 313/318.01; 362/543–549, 555, 800; 257/99, E33.066
See application file for complete search history.

(56) References Cited

U.S. PATENT DOCUMENTS

| | | | | |
|---|---|---|---|---|
| 6,693,394 | B1* | 2/2004 | Guo et al. | 315/291 |
| 2004/0202006 | A1* | 10/2004 | Pien | 362/545 |
| 2008/0062703 | A1* | 3/2008 | Cao | 362/311 |
| 2009/0273289 | A1* | 11/2009 | Sun et al. | 315/185 S |
| 2010/0231131 | A1* | 9/2010 | Anderson | 315/152 |
| 2011/0299276 | A1* | 12/2011 | Lee | 362/218 |
| 2011/0317406 | A1* | 12/2011 | Lin et al. | 362/217.1 |

\* cited by examiner

*Primary Examiner* — Donald Raleigh
(74) *Attorney, Agent, or Firm* — McNeely, Hare & War LLP; Kevin J. McNeely

(57) ABSTRACT

A LED illuminator includes positive and negative electrodes of different configurations and a LED lamp with a plurality of the LED illuminators. The LED lamp includes two or more elastic jacks, in each of which a positive electrode or a negative electrode is arranged. The elastic jack has a positive connection point and a negative connection point respectively corresponding to distal and proximal ends of the positive electrode or the negative electrode inserted therein so that the LED lamp is in electrical connection with a power supply unit. In addition, the LED illuminators may be in parallel connection. Accordingly, a slight touch of the LED illuminator allows the illuminator to be inserted into or removed from the respective elastic jack when replacing the LED illuminators of the lamp.

18 Claims, 7 Drawing Sheets

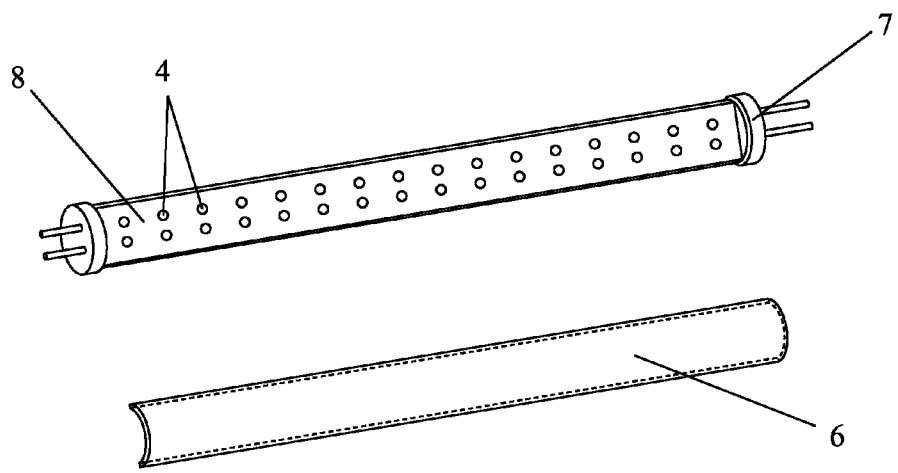
Fig. 2
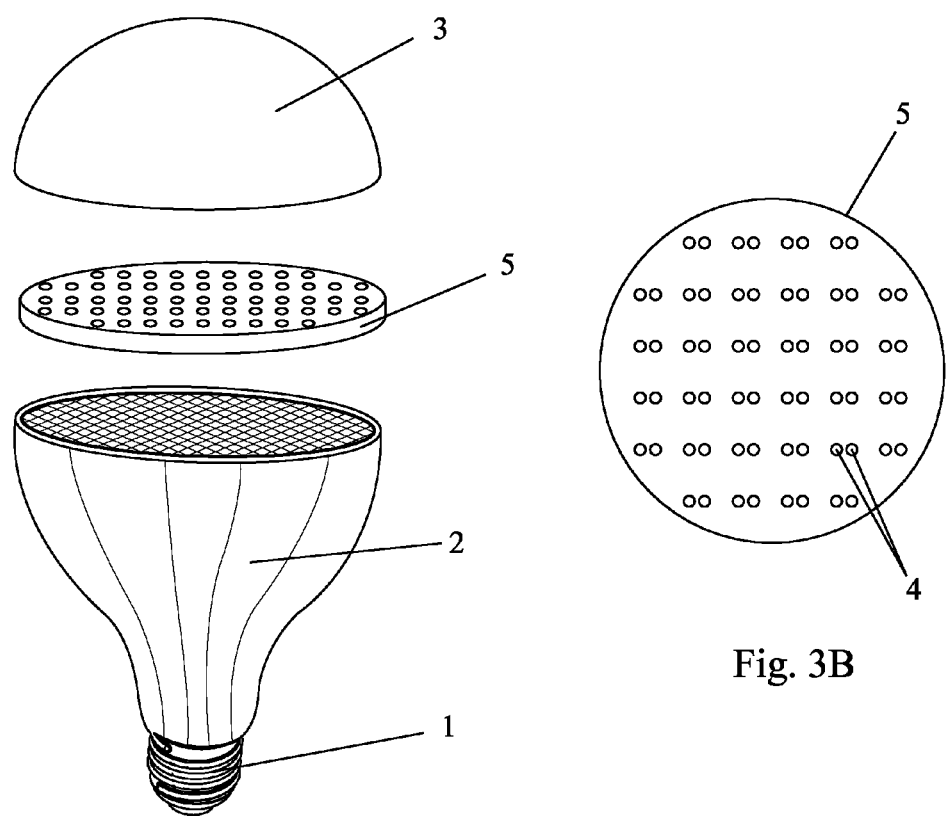
Fig. 3A
Fig. 3B

LIGHTING FIXTURE WITH REPLACEABLE LIGHT SOURCE

CROSS-REFERENCE TO RELATED APPLICATIONS

This utility patent application claims priority to Hong Kong patent application no. 11103686.0 filed on Apr. 12, 2011, which is incorporated by reference herein.

FIELD OF THE INVENTION

The present invention relates to a LED illuminator and a light emitting diode (LED) lamp comprising the same, and more particularly to a LED lamp with a replaceable LED illuminator.

BACKGROUND OF THE INVENTION

Nowadays, lighting fixtures generally employ bayonet or screw bulbs, such as E27, MR16 type screw bulbs, or the like, which use directly the AC power as a driving power source and have a relatively high voltage of about 24V, and thus could not permit the direct replacement of a LED illuminator. Though the volume of a single bulb is not large, when a plurality of bulbs are grouped together, they will generate a large amount of heat energy and consume a lot of power, which may shorten substantially their lifespan. Consequently, they are usually used alone or spaced from each other.

Further, most LED lighting fixtures available in the market are sold in their entirety, in which LED illuminators are generally soldered or screwed on a support or a power supply unit thereof, so that the LED illuminators are hard to install and replace. In addition, the power consumption, power rating, and brightness of the LED illuminators cannot be varied, thus they cannot be replaced by user at discretion, which may reduce the flexibility of the product and make the LED lighting fixture a high end consumer product. On the other hand, if any one of the components of the LED lighting fixture is damaged, then the entire product must be replaced, which may significantly decrease the recycling capability of the LED lighting fixture and also contradict to or depart from the environmental friendly concept or feature as promoted by the LED lighting fixture.

In the prior art, the LED lamp design is LED-based merely, which may not be adapted for use with other analogous LED applications, such as an organic LED (OLED). If a LED lamp contains two or more LED illuminators, all LED illuminators are assumed to be driven by the same voltage and current in the prior art; when any individual LED illuminator is damaged, the remaining LED illuminators will be affected and fail to emit light, and thus the entire LED lamp must be replaced and cause inconvenience to the user.

In addition, there is a need to discriminate a positive electrode or a negative electrode of the LED illuminator for a proper installation, or else the LED illuminator would be unable to emit light, suggesting that the LED illuminators of the prior art are not designed with the concept of easy installation.

Thus, an improved LED lamp that could overcome the above defects is desired in the field.

SUMMARY

An object of the present invention is to provide a LED lamp having a LED illuminator which is detachable or replaceable.

Another object of the present invention is to provide a LED lamp comprising a plurality of LED illuminators which could be driven separately.

A further object of the present invention is to provide a LED lamp, which is installed without the need of discriminating the positive or negative electrodes of a LED illuminator thereof.

In order for achieving the above objects, a first aspect of the present invention provides a LED illuminator comprising a LED chip, a seal housing enclosing the LED chip, and a positive electrode and a negative electrode connected with the LED chip and extending beyond the seal housing, wherein the positive and negative electrodes have different configurations.

According to an embodiment of the present invention, the positive and negative electrodes comprise respectively a distal portion away from the seal housing and a proximal portion adjacent to the seal housing, wherein the distal portion of one of the electrodes is covered with a layer of insulating material and the proximal portion thereof is exposed for electrical connection, while the proximal portion of the other electrode is covered with a layer of insulating material and the distal portion thereof is exposed for electrical connection. Preferably, the layer of insulating material is a layer formed with plastic, resin or rubber.

According to another embodiment of the present invention, the positive and negative electrodes are respectively in connection with a positive contact and a negative contact in an electrode support which is of a nonrotational symmetrical shape, or the positive and negative contacts are located on the electrode support at nonrotational symmetrical positions.

For example, the positive and negative electrodes or the positive and negative contacts may be located on the electrode support at positions in same plane but with different heights. Alternately, the positive and negative electrodes or the positive and negative contacts may be located on the electrode support at positions in same plane, and one of the positive and negative electrodes or one of the positive and negative contacts is located on a center line of the plane, while the other of the positive and negative electrodes or the other of the positive and negative contacts is located on a side edge of the plane. Optionally, the positive and negative electrodes or the positive and negative contacts may be respectively located on adjacent planes of the electrode support. Alternately, the positive and negative electrodes or the positive and negative contacts may be respectively located on opposite planes of the electrode support, and their positions are nonrotationally symmetrical.

A second aspect of the present invention provides a LED lamp comprising the foregoing LED illuminator, which further comprises a plug for connection with an external power supply, a base plate containing one or more elastic jacks, a power supply unit for power feeding of the LED illuminator having a positive electrode and a negative electrode inserted respectively into the elastic jacks, wherein, in each of the elastic jacks, positive and negative connection points corresponding respectively to the positive and negative electrodes are arranged, and the positive and negative connection points and the plug are respectively coupled electrically with the power supply unit.

With the configurations of the positive and negative electrodes of the LED illuminator and the elastic jacks, once the positive or negative electrode is inserted into the respective elastic jack, the exposed portion of the positive (or negative) electrode will be directly in contact with the positive (or negative) connection point whereby forming a electrical connection therewith.

According to the present invention, insertion of the positive or negative electrode into any one of the elastic jacks ensures that the positive electrode will form a electrical connection with the positive connection point in the elastic jack, or the negative electrode will form an electrical connection with the negative connection point in the elastic jack, without the need to discriminate cautiously the positive electrode from the negative electrode of the LED illuminator before the insertion. In other words, there is no need to discriminate the polarity of the electrode and the polarity of the elastic before insertion of the electrode into the elastic jack to cause energization and light emission.

In the LED lamp of the present invention comprising a plurality of LED illuminators, the LED illuminators could be separately driven, and connected in parallel, for example.

According to the present invention, if any one or any one set of the LED illuminators is damaged and needs to be replaced, only this damaged LED illuminator or this damaged set of LED illuminators may be replaced instead of replacing all of the LED illuminators.

According to the present invention, the power supply unit may regulate automatically a current output of each of the elastic jacks, such that LED illuminators of different brightness could be inserted into different elastic jacks regardless the voltage and current of the power supply unit and without damaging the LED illuminators. In other words, it is possible to install or replace the LED illuminators of different brightness in the elastic jacks according to the present invention, and the LED illuminators of various colors could be also installed or replaced, whereby forming a LED lamp of one or more colors or a LED lamp of full color.

Preferably, the power supply unit may regulate the brightness of the LED illuminators, which may facilitate the replacement of respective LED illuminators in a lightening state by preventing dazzling light.

According to another embodiment of the present invention, each of the elastic jacks of the LED lamp comprises a touch-eject mechanism for retaining the LED illuminator in the elastic jack or ejecting the LED illuminator from the elastic jack.

The touch-eject mechanism comprises a spring arranged at bottom of cavity of the elastic jack, deep notches and shallow notches with different depths arranged alternately at an inner wall of the elastic jack, and a gear member placed on the spring, wherein an upper surface of the gear member is in contact with a lower surface of the LED illuminator, and each of teeth of the gear member is respectively coupled with the deep notch or the shallow notch for enabling the gear member to be situated in a pressed position or an ejected position, whereby allowing the LED illuminator to be retained in or ejected from the elastic jack.

Preferably, springs are respectively mounted at the positive and negative connection points for retaining the LED illuminator in the elastic jack.

Accordingly, a slight touch of the LED illuminator allows the illuminator to be inserted into or removed from the respective elastic jack when replacing the LED illuminators of the lamp.

According to a further embodiment of the present invention, the LED lamp is of a bulb type which comprises a front portion and a rear portion detachably connected with each other. The front portion comprises a plug for connection with an external power supply, a power supply unit for driving a LED illuminator, and a lamp body in which the power supply unit is arranged, the plug being in butt connection with the lamp body. The rear portion comprises a lamp cover, a base plate containing one or more elastic jacks, and the LED illuminator; wherein the electrodes of the LED illuminator are inserted into the elastic jacks. The lamp cover is in butt connection with the lamp body, and the electrodes inside the elastic jacks are in electrical connection with the power supply unit.

Preferably, the base plate containing one or more elastic jacks is located on a connection ring, which may detached from the lamp cover.

According to a further embodiment of the present invention, the LED lamp is of a tube type which comprises a lamp body and a lamp tube cover. The lamp body comprises a plug for connection with an external power supply and a base plate containing one or more elastic jacks and connected with the plug. A power supply unit for driving a LED illuminator may be arranged in the lamp body or an additional power supply component, which may be an independent component detachable from the LED lamp. The lamp tube cover is in butt connection with the plug and encloses the base plate. The electrodes of the LED illuminator may be inserted into the elastic jacks.

Preferably, the elastic jacks and the LED illuminator are located on a connection bar, which may be detached from the lamp tube cover and the lamp body.

According to the present invention, the power source could be separated from the light source in the lamp design, and adapted for use with the conventional lamp tube cover and the plug of the prior art. A low heat energy and low power LED illuminator may be employed as the light source instead, and then they could be combined together.

With regard to the installation of the LED illuminator, the present invention provides a convenient design of elastic jack, by which a slight touch of the LED illuminator installed in the base plate allows the LED illuminator to be removed therefrom, a new LED illuminator could then be pressed down and installed therein, whereby completing the replacement of the LED illuminator.

According to the present invention, if a LED illuminator is damaged and fails to emit light, only the damaged LED illuminator rather than the entire LED lamp needs to be replaced, whereby reducing the manufacturing and operating cost of the LED lamp, which will be more beneficial to the environmental protection.

BRIEF DESCRIPTION OF THE DRAWINGS

FIG. 2 is a schematic view of an embodiment of a tube type LED lamp according to the present invention.

FIG. 3A is a schematic view of a LED lamp of the present invention, wherein the elastic jacks formed in a connection ring are installed in or removed from the LED lamp.

FIG. 3B is a schematic view showing the distribution of the elastic jacks in the connection ring of FIG. 3A.

DETAILED DESCRIPTION

The invention will be described in preferred embodiments with reference to the drawings.

Figure 1A:
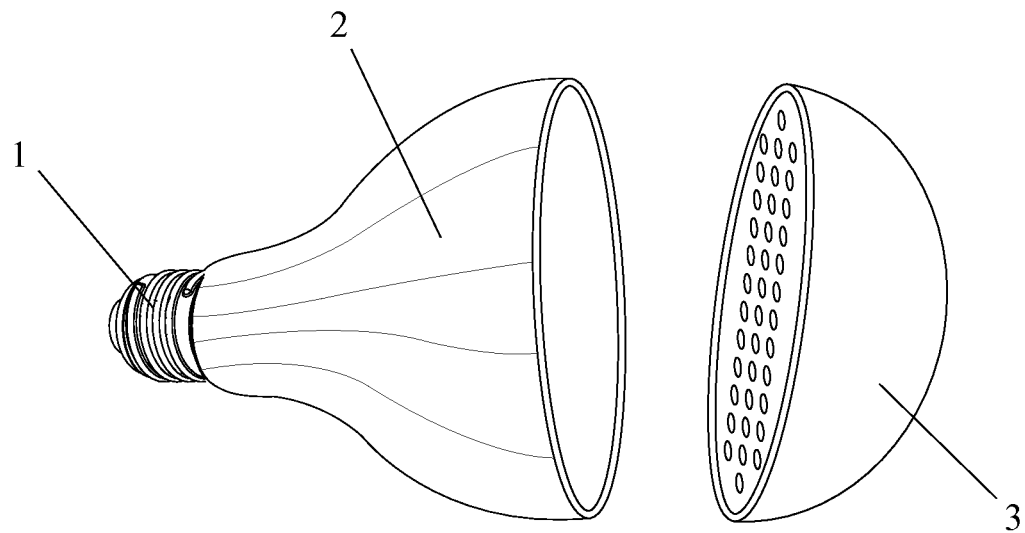
FIG. 1A is a schematic view of an embodiment of a bulb type LED lamp according to the present invention.
Figure 1B:
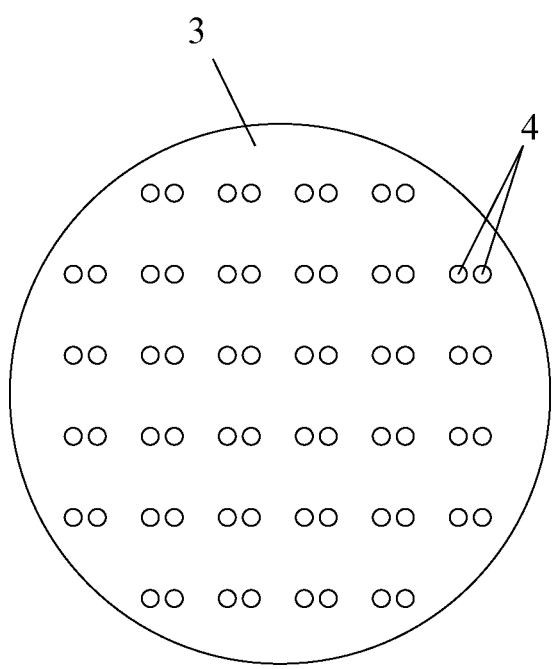
FIG. 1B is a schematic view showing the distribution of the elastic jacks of FIG. 1A.

FIG. 1A is a schematic view of a bulb type LED lamp according to an embodiment of the present invention. FIG. 1B is a schematic view showing the distribution of the elastic jacks of FIG. 1A.

As illustrated in FIG. 1A, the bulb type LED lamp could be divided into two portions, namely a front portion and a rear portion 3. The front portion comprises a plug 1 for connection with an external power supply, a power supply unit (not shown) for driving a LED illuminator, and a lamp body 2 in which the power supply unit is arranged and which is in butt connection with the lamp body 2. The rear portion 3 comprises a lamp cover, a base plate containing one or more elastic jacks 4, and the LED illuminator having (positive and/or negative) electrodes inserted into the elastic jacks 4. The lamp cover 3 and the lamp body 2 are detachably connected by means of screw or bayonet, and electrode connection points located inside the elastic jacks are in electrical connection with the power supply unit.

Unlike the present invention, the lamp body and the rear portion of the prior art bulb type LED lamp are provided as a single component, and the LED illuminators are usually firmly mounted in place by soldering, for example. In this way, the configuration of the LED lamp of the prior art do not allow the LED illuminators to be replaced one by one, it is the entire LED lamp that could be replaced.

As can be seen from FIG. 1A, a plurality of pairwisely arranged elastic jacks are arranged on the base plate of the rear portion 3 for mounting a plurality of LED illuminators on the base plate. The plurality of the LED illuminators could be of the same or different brightness or colors, so as to meet different requirements.

Preferably, the base plate containing the elastic jacks 4 is arranged on a connection ring 5 which could be detached from the rear portion 3, as illustrated in FIG. 3A. FIG. 3B illustrates the distribution of the elastic jacks on the connection ring. The present embodiment facilitates the replacement of the connection ring 5 and the LED illuminators inserted into the elastic jacks 4, for example, the quick replacement of a connection ring 5 having different distribution patterns of the LED illuminators, whereby enabling the bulb type LED lamp to display different lighting patterns or colors without the need of replacing the front portion and the rear portion 3 of the LED lamp.

In the foregoing bulb type LED lamp, the plug 1 of the front portion may be a standard plug available in the prior art (e.g. E27, MR16, etc.), which could be a bayonet or screw type plug, for example. Then, the LED lamp of the invention could be mounted in an existing lamp holder.

FIG. 2 illustrates a schematic view of a tube type LED lamp according to another embodiment of the present invention, in which the LED illuminator is applied into a lamp tube.

The lamp tube could be divided into two portions: a lamp tube cover 6 and a lamp body 7. The lamp body 7 comprises a plug for connection with an external power supply and a base plate 8 containing one or more elastic jacks and in connection with the plug. A power supply unit for driving a LED illuminator is arranged in the lamp body or an additional power supply component which may be an independent component detached from the lamp tube. The lamp tube cover 6 is detachably connected with the plug of the lamp body 7, and encloses the base plate 8. The electrodes of the LED illuminator may be inserted into the elastic jacks 4 on the base plate 8.

Figure 4A:
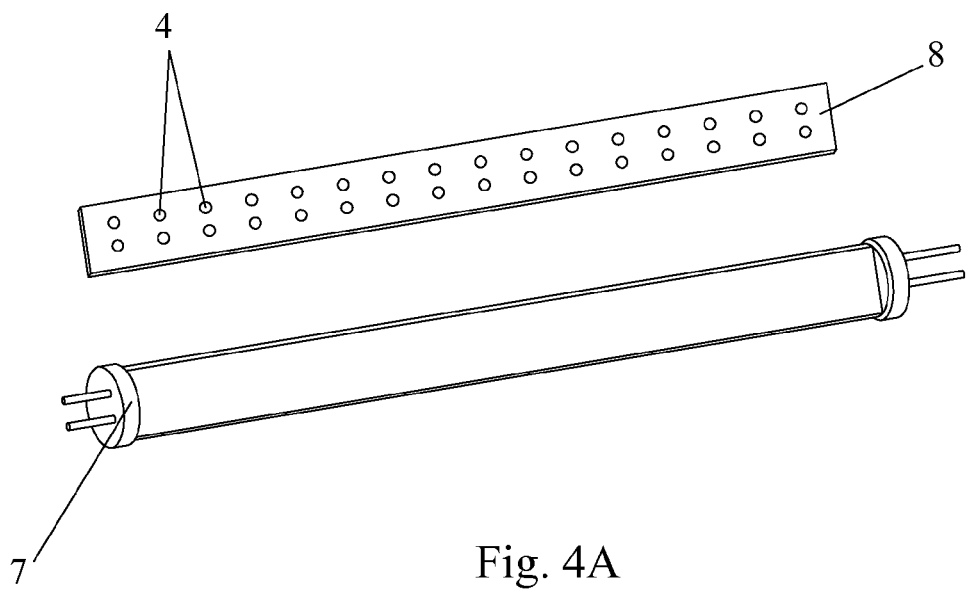
FIG. 4A is a schematic view of a LED lamp of the present invention, wherein the elastic jacks formed in a connection bar are installed in or removed from the LED lamp.
Figure 4B:
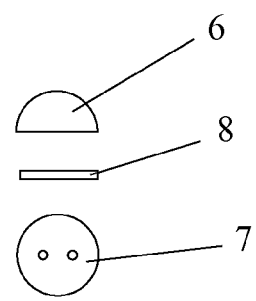
FIG. 4B is an exploded side view of FIG. 4A.

FIG. 4A is a schematic view of a LED lamp of the present invention, wherein the elastic jacks are installed in or remove from the LED lamp by way of a connection bar. Preferably, the elastic jacks 4 and the LED illuminators are located on the connection bar which is detached from the lamp tube cover 6 and the lamp body 7, as shown in FIG. 4A. FIG. 4B is an exploded side view of FIG. 4A, showing that the lamp tube cover 6, the base plate 8, and the lamp body 7 are detached from one another. The plug of the tube type LED lamp according to the present invention could be of a standard specification, for example, T10, T8, or T5 type lamp plug.

Figure 5A:
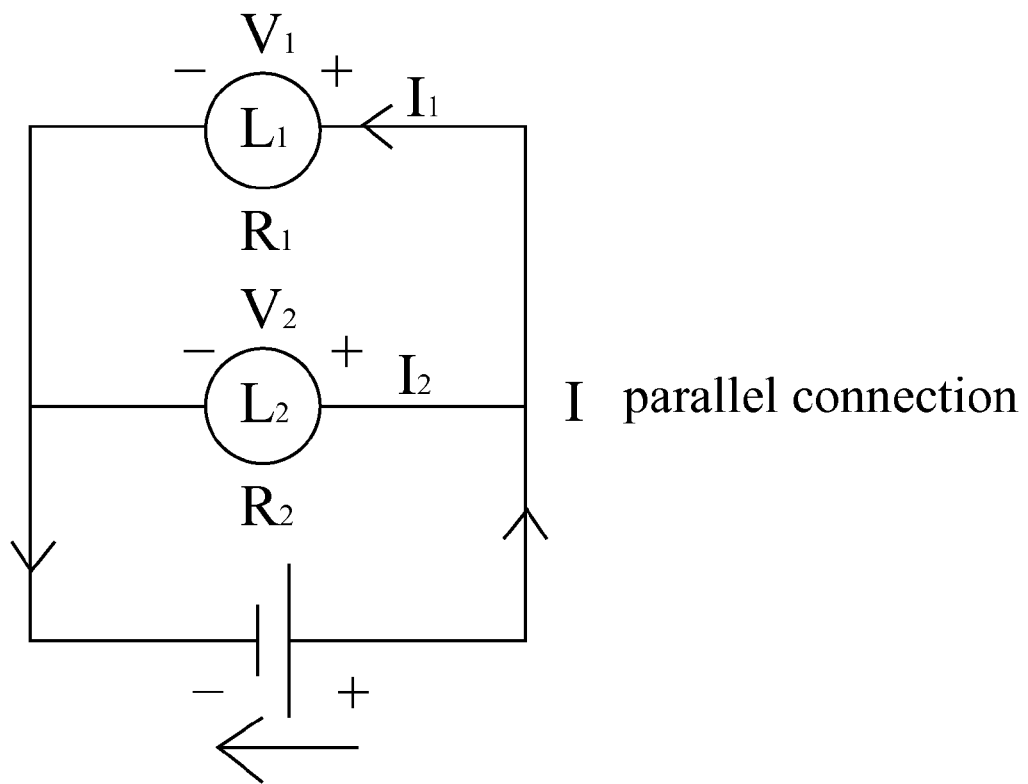
FIG. 5A is a schematic circuit diagram of a LED lamp of the present invention.
Figure 5B:
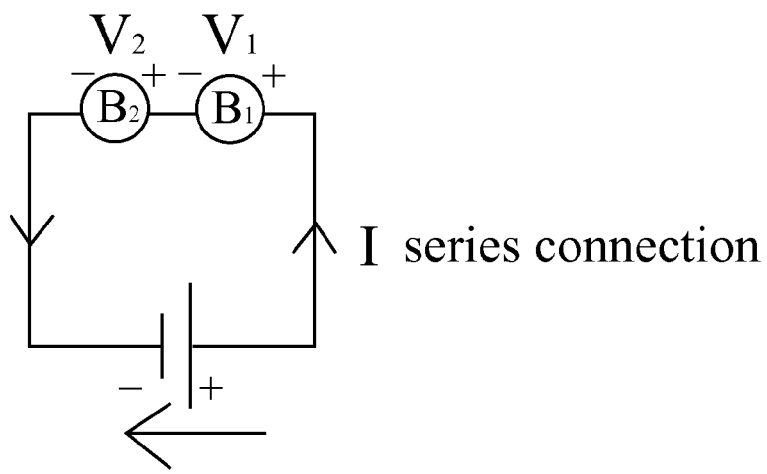
FIG. 5B is a schematic circuit diagram of a LED lamp of the prior art.

FIG. 5A is a schematic circuit diagram of a LED illuminator of the present invention, and FIG. 5B is a schematic circuit diagram of a LED illuminator of the prior art.

As can be seen in FIG. 5B, the LED lamp of the prior art contains a plurality of LED illuminators B1, B2 (e.g. a bulb) in series connection.

While in FIG. 5A, the LED lamp of the present invention comprise a plurality of LED illuminators L1, L2 which are driven separately, and they may be in parallel connection, for example.

According to the present invention, if any one of the LED illuminators in the LED lamp is damaged and needs to be replaced, it is permitted to replace only one or more or one set of LED illuminators instead of replacing all of the LED illuminators.

Further, in the LED lamp according to the present invention, the power supply unit may regulate automatically a current output for each of the LED illuminators, such that LED illuminators of various brightness could be inserted into different elastic jacks regardless whether the voltage and current of the power supply unit are matched or not, as a result, the LED illuminators would not be damaged. In other words, in the same LED lamp of the invention, the LED illuminators of various brightness could be installed or replaced, and the LED illuminators of various colors could also be installed or replaced, whereby forming a LED lamp of one or more colors or a LED lamp of full color.

Preferably, the power supply unit may regulate the brightness of the LED illuminators, allowing for the replacement of respective LED illuminators in a lightening state by preventing dazzling light.

According to the present invention, the voltage applied to each of the LED illuminators mounted in the LED lamp could be regulated, or the output voltage of the power supply unit could be regulated, for example, to reduce the brightness of the LED illuminator during the replacement of any specific LED illuminator in order not to dazzle the user, or to adjust the brightness of the LED illuminator during normal use for different brightness requirements.

The inventor finds that the LED illuminator of the prior art generally comprises a housing containing a LED chip and two (positive and negative) electrodes parallelly extending beyond the housing. Therefore, the positive and negative electrodes of the LED illuminator of the prior art are basically identical and hard to be identified. Normally, the positive and negative electrodes could only be discriminated by the signs "+" and "−" marked on the housing. Therefore, another aspect of the present invention makes an improvement on the configuration of the electrodes of the LED illuminator by providing the positive and negative electrodes of different configurations, whereby the installation and/or removal of the LED illuminator will become easier and the positive and negative electrodes will not be misplaced. According to the present invention, the positive and negative electrodes of the LED illuminator could take different shapes, or be arranged at different positions of the housing.

Figure 6:
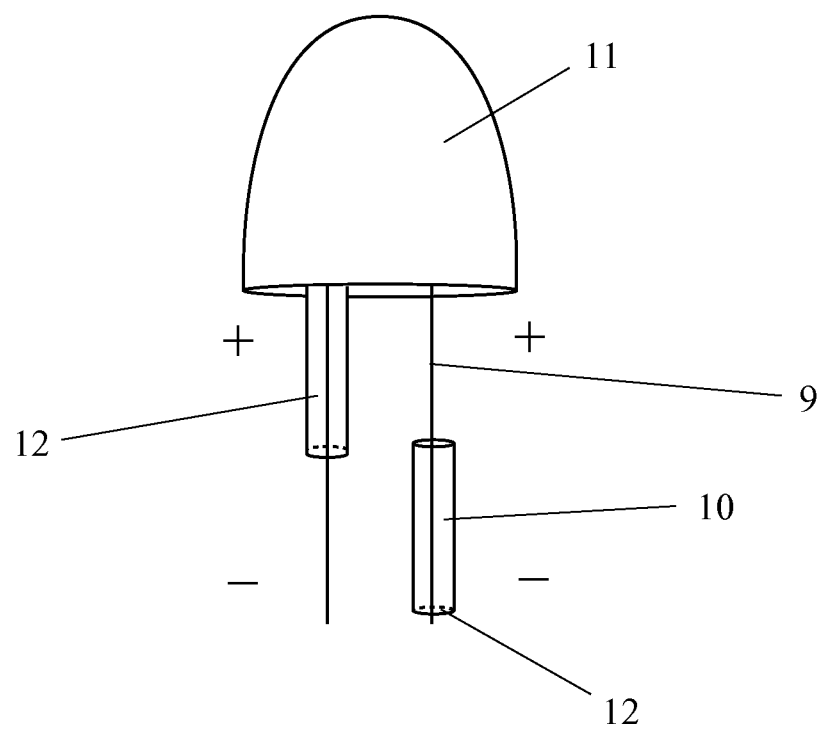
FIG. 6 is a schematic view of a LED illuminator of a LED lamp of the present invention.

FIG. 6 is a schematic view of a LED illuminator mounted in a LED lamp of the present invention. As shown in FIG. 6, the LED illuminator 11 comprises a LED chip (not shown), a seal housing enclosing the LED chip, and a positive electrode 9 and a negative electrode 10 connected with the LED chip. A distal portion of the positive electrode 9 away from the seal housing is covered with a layer of insulating material, and a proximal portion of the negative electrode 10 adjacent to the seal housing is also covered with a layer of insulating material 12. The positions of the positive and negative electrodes and the layer of insulating material 12 are interchangeable, which still falls into the scope of the present invention.

In addition, the positive and negative connection points corresponding respectively to the distal and proximal portions of the positive and negative electrodes are arranged in each of the elastic jacks 4.

In other words, as shown in FIG. 6, the insulating material may be covered on various positions of the pins of the LED illuminator 11 for identification of the positive electrode 9 and the negative electrode 10 thereof, and both the positive and negative connection points are arranged at different depths in each of the elastic jacks 4 of the LED lamp to respectively correspond to the exposed portions of the positive electrode 9 and negative electrode 10.

With the configurations of the positive and negative electrodes of the LED illuminator and the elastic jacks discussed above, once the positive or negative electrode of the LED illuminator is inserted into the respective elastic jack, the exposed portion of the proximal portion or the distal portion of the positive (or negative) electrode will be directly in contact with the positive (or negative) connection point whereby forming an electrical connection therewith, while for the portion of the electrode covered with the layer of the insulting material, it is the insulating material that will contact the positive (or negative) connection point, whereby failing to establish an electrical connection therewith.

Figure 7:
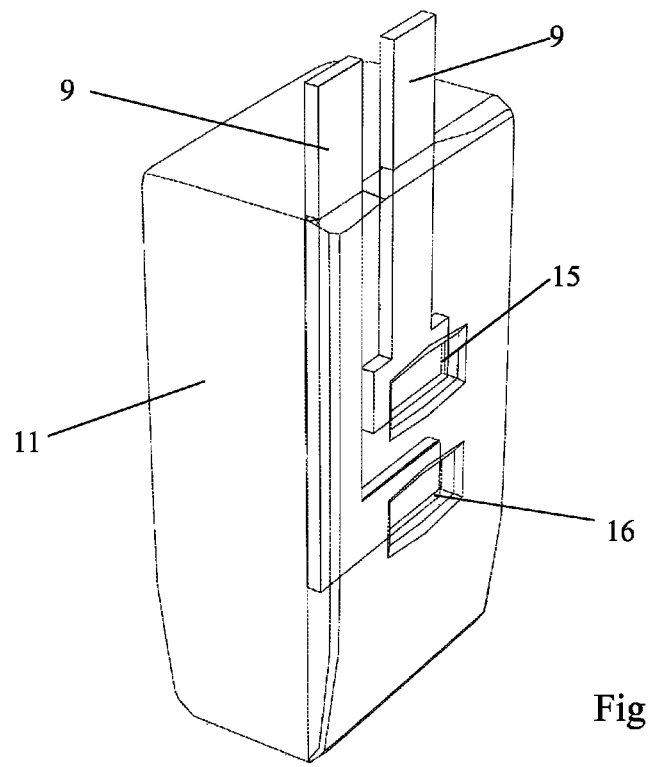
FIG. 7 is a schematic view of an electrode support of a LED illuminator according to one embodiment of the present invention.

FIG. 7 illustrates a LED illuminator according to another embodiment of the present invention, wherein the LED chip and LED housing are not shown, and the reference sign "9" represents two electrodes of the LED illuminator, namely the positive and negative electrodes. The positive and negative electrodes 9 are respectively connected with a positive contact 15 and a negative contact 16 in an electrode support 11. Herein, the two contacts 15 and 16 represent respectively the positive connection point or the negative connection point for connection with the positive or negative electrodes based on the same principle of the circuitry. In FIG. 7, the positive contact 15 and the negative contact 16 are inwardly depressed with respect to the outer surface of the electrode support 11, so as to be retained in the elastic jack; and other surfaces of the electrode support 11 are non-conductive and could be made of insulting plastics, for example. The electrode support 11 could also be integrated with the housing of the LED illuminator such that the electrodes 9 will not be exposed. Further, the shape of the electrode support 11 matches with the shape of the elastic jack 4 of the LED lamp.

The electrode support may be of a nonrotationally symmetrical shape, or the positive contact 15 and the negative contact 16 may be located on the electrode support at nonrotationally symmetrical positions. For example, the positive and negative electrodes or the positive and negative contacts may be located on the electrode support at positions in same plane but with different heights. Alternately, the positive and negative electrodes or the positive and negative contacts may be located on the electrode support at positions in same plane, and one of the positive and negative electrodes or one of the positive and negative contacts may be located on a center line of the plane, while the other of the positive and negative electrodes or the other of the positive and negative contacts may be located on a side edge of the plane. Optionally, the positive and negative electrodes or the positive and negative contacts may be respectively located on adjacent planes of the electrode support. Alternately, the positive and negative electrodes or the positive and negative contacts may be respectively located on opposite planes of the electrode support at nonrotationally symmetrical positions.

In the above embodiments, the electrode support 11 and the electrodes 9 are positioned such that the two electrodes of the LED illuminator or the electrode contacts apparently differ from each other, consequently, the electrodes will not be misplaced.

The elastic jack 4 of the present invention employs preferably a touch-eject mechanism for retaining the LED illuminator therein or ejecting the LED illuminator therefrom. The touch-eject mechanism is somewhat analogous to a design of a pen tube of touch-eject type retractable ballpoint pen, and such a design of the ballpoint pen is modified for use in the elastic jack design of the present invention.

Figure 8:
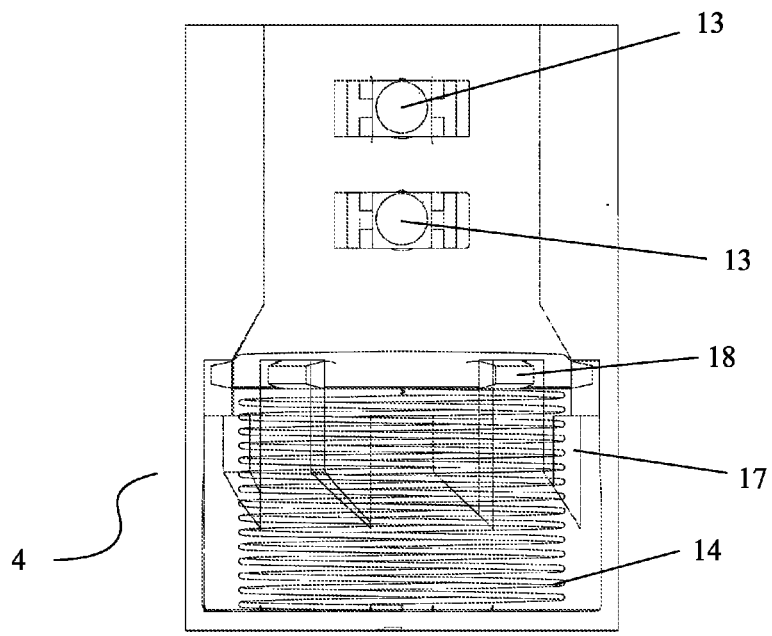
FIG. 8 is a sectional front view of an elastic jack of a LED lamp of the present invention.
Figure 9:
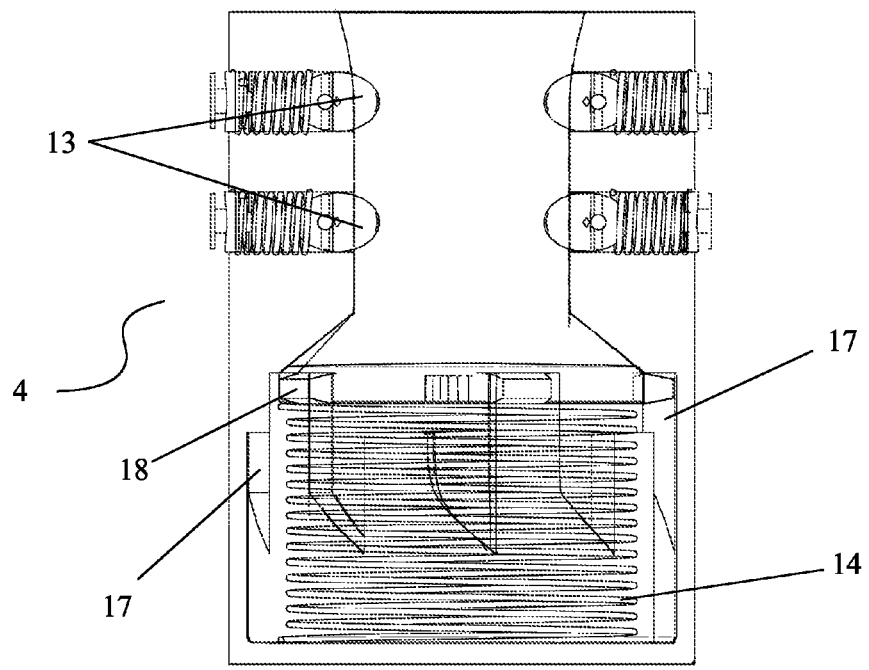
FIG. 9 is a sectional side view of an elastic jack of a LED lamp of the present invention.
Figure 10:
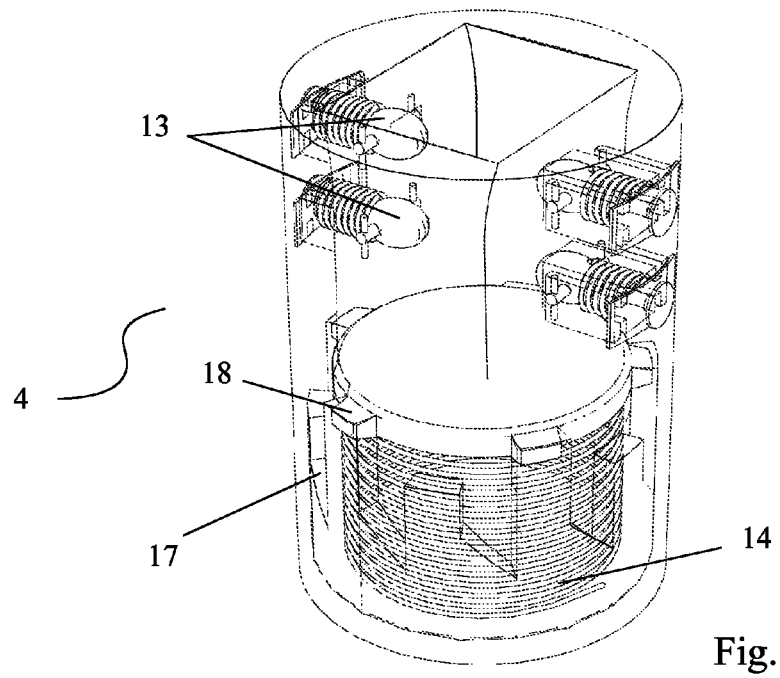
FIG. 10 is a three-dimensional diagram of an elastic jack of a LED lamp of the present invention.

FIGS. 8-10 respectively illustrate a schematic view, a sectional front view, and a three-dimensional diagram of the elastic jack 4. The touch-eject mechanism of the elastic jack 4 comprises a spring 14 arranged at bottom of cavity of the elastic jack, deep notches and shallow notches 17 with different depths arranged alternately at an inner wall of the elastic jack, and a gear member placed on the spring, wherein an upper surface of the gear member is in contact with a lower surface of the LED illuminator, and each of teeth 18 of the gear member is coupled respectively with the deep notch or the shallow notch 17 for enabling the gear member to be situated in a pressed position or an ejected position, whereby allowing the LED illuminator to be retained in position or ejected from the elastic jack.

The gear member will be rotated by an angle each time it is depressed, such that the tooth 18 of the gear member will be moved from one deep/shallow notch 17 into the adjacent shallow/deep notch 17. When the tooth 18 is in the shallow notch, the gear member is situated at a lower position in the elastic jack 4, and correspondingly, the electrode support of the LED lamp is retained in such a manner that the positive contact 15 and the negative contact 16 will be respectively in contact with the electrode connection point 13, allowing the electrode support 11 to be situated in the elastic jack 4. When the tooth 18 is in the deep notch, the gear member is situated at an upper position in the elastic jack, and correspondingly, the electrode support of the LED lamp will be ejected from the elastic jack 4 by the gear member.

Further, springs may be respectively mounted at the positive and negative connection points 13 in connection with the positive contact 15 and the negative contact 16 of the LED illuminator, whereby allowing the vertical positions of the positive and negative connection points 13 in the elastic jack to be slightly changed. In this way, the springs not only serve to power up the LED illuminator, but also retain the LED illuminator in the elastic jack 4 by the spring force at the connection points 13.

Though two pairs of connection points 13 served as positive and negative connection points are shown in FIGS. 9 and 10, the object of the present invention could be realized by providing only one pair of connection points. The pair of connection points 13 could be arranged not only at the same side of the elastic jack but also at the opposite sides for corresponding to the electrodes or electrode contacts of the LED illuminator, respectively.

It should be appreciated that any kind of touch-eject configurations or connection means of the prior art may be used as the touch-eject mechanism in the elastic jack 4, and such configurations shall fall into the scope of the present invention.

In short, when any one of the LED illuminator of the existing LED lamp in the art is damaged, then the entire LED lamp needs to be replaced. On the contrary, the LED lamp of the present invention could be used by replacing merely the damaged LED illuminator, whereby reducing substantially the cost for long term use of the LED lamp. The user could replace and make use of suitable LED illuminators such as LED illuminators of different brightness or colors according to the actual needs, so as to enhance the flexibility of the LED lamp of the present invention. The present invention also provides additionally the reusability and changeability for the LED lamp, making it possible that the LED lamp of the field is more environmentally friendly and competitive.

The LED illuminator of the present invention could be easily installed and formed an electrical connection with the elastic jacks, because the elastic jacks permits very easy insertion and removal of the LED illuminator of the present invention, and there is no need for soldering or applying a relatively large magnitude of force. In addition, the design of the elastic jack of the present invention also allows the replacement of a LED illuminator of higher brightness, the change of color of the LED illuminator, the replacement of single LED illuminator with multiple of LED illuminators, and the replacement of a damaged LED illuminator with a new LED illuminator.

According to the present invention, each of the LED illuminators could be accompanied with a suitable miniature transformer for providing a suitable voltage and current for the LED illuminator. Further, a plurality of elastic jacks could be formed on the same base plate for the installation of multiple LED illuminators of different brightness or colors, and each of the LED illuminators is powered with the suitable voltage and current provided by the respective miniature transformer.

As the LED illuminator is a bipolar device, the proper connection of its positive and negative electrodes is important. In this regard, the design of the present invention makes an improvement that the same elastic jack could accept both the positive and negative electrodes, and the polarity of the electrode will be automatically determined after the insertion of the LED illuminator.

With regard to the circuit design of the LED lamp, the invention has modified the series connection between the respective LED illuminators of the prior art to the parallel connection; therefore, when any one of the LED illuminators is damaged, the other LED illuminators can maintain to emit light, which is not the case in the prior art. According to the invention, it is necessary to replace the damaged LED illuminator only.

According to the present invention, the design of voltage regulation of the power supply unit of the LED lamp allows the reduction in voltage of the respective elastic jacks, which in turns reduces the brightness of the LED illuminators connected with the elastic jacks, thereby preventing the dazzling during the replacement of any specific LED illuminator thereof.

While the principles and configurations of the present invention have been described above by way of preferred embodiments, the above description should be considered as exemplary and not limitative. Those skilled in the art may make various improvements and/or modifications thereto according to the teachings as set forth hereinbefore, and all such improvements and/or modifications shall fall into the scope of the claims of the present invention as enclosed herewith.

What is claimed is:

1. A LED illuminator, comprising:
   a LED chip,
   a sealed housing enclosing the LED chip, and
   a positive electrode and a negative electrode connected with the LED chip and extending beyond the sealed housing, wherein the positive and negative electrodes have different configurations that comprise, respectively, a distal portion away from the sealed housing and a proximal portion adjacent to the sealed housing, the distal portion of one of the electrodes is covered with a layer of insulating material and the proximal portion thereof is exposed for electrical connection, while the proximal portion of the other electrode is covered with a layer of insulating material and the distal portion thereof is exposed for electrical connection.

2. A LED illuminator according to claim 1, wherein the layer of insulating material is a layer formed with plastic, resin or rubber.

3. A LED illuminator according to claim 1, wherein the positive and negative electrodes are respectively in connection with a positive contact and a negative contact in an electrode support of a nonrotationally symmetrical shape, or the positive and negative contacts are located on the electrode support at nonrotationally symmetrical positions.

4. A LED illuminator according to claim 3, wherein the positive and negative electrodes or the positive and negative contacts are located on the electrode support at positions in same plane but with different heights.

5. A LED illuminator according to claim 3, wherein the positive and negative electrodes or the positive and negative contacts are located on the electrode support at positions in same plane, and one of the positive and negative electrodes or one of the positive and negative contacts is located on a center line of the plane, and the other of the positive and negative electrodes or the other of the positive and negative contacts is located on a side edge of the plane.

6. A LED illuminator according to claim 3, wherein the positive and negative electrodes or the positive and negative contacts are respectively located on adjacent planes of the electrode support.

7. A LED illuminator according to claim 3, wherein the positive and negative electrodes or the positive and negative contacts are respectively located on opposite planes of the electrode support, and their positions are nonrotationally symmetrical.

8. A LED lamp, comprising:
   a LED chip,
   a sealed housing enclosing the LED chip,
   a positive electrode and a negative electrode connected with the LED chip and extending beyond the sealed housing, wherein the positive and negative electrodes have different configurations,
   a plug for connection with an external power supply, a base plate containing one or more elastic jacks wherein each of the elastic jacks comprises a touch-eject mechanism for retaining the LED illuminator in the elastic jack or ejecting the LED illuminator from the elastic jack, and a power supply unit for power feeding of the LED illuminator having a positive electrode and a negative electrode inserted respectively into the elastic jacks, wherein, in each of the elastic jacks, positive and negative connection points corresponding respectively to the positive and negative electrodes are arranged, and the positive and negative connection points and the plug are respectively coupled electrically with the power supply unit.

9. A LED lamp according to claim 8, wherein the LED lamp comprises a plurality of the LED illuminators in parallel connection, and the elastic jacks are arranged in pairs.

10. A LED lamp according to claim 9, wherein the plurality of the LED illuminators are of two or more brightness or colors.

11. A LED lamp according to claim 8, wherein the power supply unit regulates automatically a current output for each of the elastic jacks.

12. A LED lamp according to claim 8, wherein the power supply unit is adapted for brightness regulation of the LED illuminator.

13. A LED lamp according to claim 8, wherein the touch-eject mechanism comprises a spring arranged at bottom of cavity of the elastic jack, deep notches and shallow notches with different depths arranged alternately at an inner wall of the elastic jack, and a gear member placed on the spring, wherein an upper surface of the gear member is in contact with a lower surface of the LED illuminator, and each of teeth of the gear member is coupled respectively with the deep notch or the shallow notch for enabling the gear member to be situated in a pressed position or an ejected position, whereby allowing the LED illuminator to be retained in position or ejected from the elastic jack.

14. A LED lamp according to claim 8, wherein springs are respectively mounted at the positive and negative connection points for retaining the LED illuminator in the elastic jack.

15. A LED lamp according to claim 8, wherein the LED lamp is of a bulb type which comprises a front portion and a rear portion detachably connected, wherein the front portion comprises the plug and a lamp body in which the power supply unit is arranged; and the rear portion comprises a lamp cover, the base plate and the LED illuminator.

16. A LED lamp according to claim 8, wherein the LED lamp is of a bulb type which comprises a front portion, a connection ring and a rear portion detachably connected together, wherein the front portion comprises the plug and a lamp body in which the power supply unit is arranged; the connection ring comprises the base plate and the LED illuminator; and the rear portion comprises a lamp cover.

17. A LED lamp according to claim 8, wherein the LED lamp is of a tube type which comprises a lamp body comprising the plug and the base plate, and the power supply unit being arranged in the lamp body or an additional power supply component; and a lamp tube cover being detachably connected with the plug and enclosing the base plate.

18. A LED lamp according to claim 8, wherein the LED lamp is of a tube type which comprises a lamp body, a connection bar and a lamp tube cover detachably connected together, wherein the lamp body comprises the plug, and the power supply unit being arranged in the lamp body or an additional power supply component; on the connection bar are located the elastic jacks and the LED illuminator; and the lamp tube cover is in butt connection with the plug and encloses the base plate.

* * * * *